US007243033B2

(12) United States Patent
Sato et al.

(10) Patent No.: US 7,243,033 B2
(45) Date of Patent: Jul. 10, 2007

(54) INSPECTION APPARATUS

(75) Inventors: Chie Sato, Tokyo (JP); Yusuke Kishine, Tokyo (JP); Tetsuya Ohtani, Tokyo (JP); Minoru Akutsu, Tokyo (JP); Hiroshi Sugawara, Tokyo (JP); Akira Toyama, Tokyo (JP); Hirotoshi Kodaka, Tokyo (JP); Katsuya Ikezawa, Tokyo (JP); Shinji Kobayashi, Tokyo (JP); Akira Miura, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 2 days.

(21) Appl. No.: 11/180,905

(22) Filed: Jul. 14, 2005

(65) Prior Publication Data
US 2006/0025708 A1    Feb. 2, 2006

(30) Foreign Application Priority Data
Jul. 15, 2004    (JP)    ............ P. 2004-207989

(51) Int. Cl.
*G01R 13/00*    (2006.01)
(52) U.S. Cl. ............ 702/66; 702/67; 455/522
(58) Field of Classification Search ............ 702/66, 702/67; 455/522
See application file for complete search history.

(56) References Cited

U.S. PATENT DOCUMENTS

| 5,613,015 | A  | * | 3/1997  | Suzuki et al. | 382/173 |
| 5,864,798 | A  | * | 1/1999  | Miseki et al. | 704/225 |
| 6,347,231 | B1 | * | 2/2002  | Miya          | 455/522 |
| 6,801,647 | B1 | * | 10/2004 | Arakawa       | 382/132 |
| 6,864,745 | B2 | * | 3/2005  | Ode et al.    | 330/149 |
| 2001/0014922 | A1 | * | 8/2001  | Kuge          | 710/36 |
| 2002/0089996 | A1 | * | 7/2002  | Komatsu et al.| 370/442 |
| 2003/0007222 | A1 | * | 1/2003  | Kwasaki et al.| 359/189 |
| 2004/0049104 | A1 | * | 3/2004  | Kishi         | 600/301 |
| 2004/0090617 | A1 | * | 5/2004  | Geh et al.    | 356/124 |
| 2004/0171352 | A1 | * | 9/2004  | Maeda et al.  | 455/67.13 |
| 2004/0208260 | A1 | * | 10/2004 | Chan et al.   | 375/297 |
| 2004/0227580 | A1 | * | 11/2004 | Otsuka et al. | 333/4 |
| 2004/0240569 | A1 | * | 12/2004 | Rudowicz et al.| 375/260 |
| 2005/0013450 | A1 | * | 1/2005  | Kumazawa      | 381/103 |
| 2006/0025708 | A1 | * | 2/2006  | Sato et al.   | 600/595 |
| 2006/0030272 | A1 | * | 2/2006  | Nakamizo et al.| 455/69 |

FOREIGN PATENT DOCUMENTS

JP    2000-295298 A    10/2000

OTHER PUBLICATIONS

Ikuro Aoki, et al., "Development of HBT-IC Module for 50-GBPS Optical Communication Systems", Yokogawa Technical Report English Edition, 2002, pp. 1-6, No. 34.
Seiichi Tsutsumi, et al., "Development of Ultra-compact 10Gbit/s Bit Error Rate Testers", Ando Technical Bulletin, Jan. 2004, pp. 18-22.

* cited by examiner

*Primary Examiner*—Carol S. W. Tsai
(74) *Attorney, Agent, or Firm*—Sughrue Mion, PLLC

(57) ABSTRACT

An inspection apparatus inspects an inspected object based on a waveform quality of a signal that the inspected object outputs. The inspection apparatus has a power supply section which outputs a control signal that controls an output of the inspected object, a waveform measuring section which measures the signal that the inspected object outputs to generate a waveform image, an analyzing section which derives a value indicating a waveform quality from the waveform image that the waveform measuring section measures, a deciding section which decides whether or not the value derived by the analyzing section satisfies a target value, and an optimizing section which changes a set value of the control signal that the power supply section outputs, based on a decision result of the deciding section.

17 Claims, 8 Drawing Sheets

```
MODULE INSPECTION SYSTEM
MODULE NAME > T585
DATA SAVE FOLDER [2004_0310_1056_T585]

INSPECTION START DATE AND TIME 2004/3/31 13:30:30
INSPECTION END EXPECTED DATE AND TIME 2004/3/31 15:01:34
TOTAL NUMBER OF INSPECTED MODULES 21
NUMBER OF NON-DEFECTIVE UNIT 20, NUMBER OF DEFECTIVE
UNIT 1, NON-DEFECTIVE UNIT RATE 95.2 [%]
INSPECTION START
CH1
4V 30[%] O,  40[%] O,  50[%] O.  60[%] O,  70[%] O
3V 30[%] O,  40[%] O,  50[%] O.  60[%] O,  70[%] O
2V 30[%] O,  40[%] O,  50[%] O.  60[%] O,  70[%] O
1V 30[%] O,  40[%] O,  50[%] O.  60[%] O,  70[%] O
CH2
4V 30[%] O,  40[%] O,  50[%] O.  60[%] O,  70[%] O
3V 30[%] O,  40[%] O,  50[%] O.  60[%] O,  70[%] O
2V 30[%] O,  40[%] O,  50[%] O.  60[%] O,  70[%] O
1V 30[%] O,  40[%] O,  50[%] O.  60[%] O,  70[%] O
INSPECTION END

INSPECTION START DATE AND TIME 2004/3/31 13:30:30
INSPECTION END DATE AND TIME 2004/3/31 15:02:40
TOTAL NUMBER OF INSPECTED MODULES 22
NUMBER OF NON-DEFECTIVE UNIT 21, NUMBER OF DEFECTIVE
UNIT 1, NON-DEFECTIVE UNIT RATE 95.4 [%]
```

INSPECTION APPARATUS

CROSS-REFERENCE TO RELATED APPLICATIONS

This application is based upon and claims the benefit of priority from the prior Japanese Patent Applications No. 2004-207989, filed on Jul. 15, 2004, the entire contents of which are incorporated herein by reference.

BACKGROUND OF THE INVENTION

1. Field of the Invention

The present invention relates to an inspection apparatus for inspecting an inspected object based on a waveform quality of a signal that the inspected object outputs. The present invention especially relates to an inspection apparatus capable of obtaining stable results by automating the inspecting steps including the sensory inspection.

2. Description of the Related Art

On the delivery inspection line of the communication device (e.g., multiplexer IC, demultiplexer IC, modulator driver IC, very high-speed logic IC, or the like) used in the transmission/reception of the digital communication (See Document 1 mentioned below, for example.), and on the delivery inspection line of the communication measuring apparatus including the communication device (e.g., pulse pattern generating apparatus, bit error rate measuring apparatus, or the like) (See Document 2 mentioned below, for example.), and so forth, the inspection is carried out by detecting the waveform quality (also called as the "waveform quality" hereinafter) based on the waveform image that is called an eye pattern (See JP-A-2000-295298, for example.). In particular, in the high-speed communication device (a bit rate of which exceeds 10 [Gbps], for example), the eye pattern is often used as the index of the waveform quality.

FIG. 8 is a view showing a configuration of an inspection apparatus in the related art. A high-speed communication device 1 is an inspected object, and outputs the pulse pattern signal that has a high level and a low level. A power supply section 2 supplies an electric power to the communication device 1, and outputs a control signal (current, voltage, or the like).

An oscilloscope 3 generate the eye pattern by measuring the signal fed from the communication device 1, and derives the characteristic value indicating the waveform quality based on the eye pattern. Also, the oscilloscope 3 displays the eye pattern and a characteristic value on a display screen. A personal computer 4 records the inspection results of the communication device 1.

An operation of such inspection apparatus will be explained hereunder.

First, the inspector manually operates the power supply unit 2 and causes the unit to output a predetermined power and a plurality of control signals to the communication device 1. Here, the control signal can be regarded as a parameter applied to determine the waveform quality of the communication device 1. For example, there are a voltage used to control an amplitude, a voltage used to control a cross point, a voltage used to control an offset, a voltage used to control respective levels at which an upper limit value and a lower limit value of the waveform are clipped, and the like.

Then, the oscilloscope 3 measures the signal being output from the communication device 1, and displays the eye pattern and the characteristic value. The characteristic value indicates the waveform quality and is derived from the eye pattern. Also, a section for detecting the typical characteristic values is incorporated into the normal oscilloscope 3 that is commercially available. As the typical characteristic values, there are an amplitude (difference between the high level and the low level), an offset (difference between a 0 [V] level and an intermediate level between the low level and the high level), a cross point, an S/N (signal to noise ratio), a jitter, a rise time, a fall time, etc., for example. Also, in most cases these characteristic values are provided in the specification of the communication device.

Then, the inspector checks the eye pattern and the characteristic value displayed on the oscilloscope 3 with the eye. Also, the inspector inputs the parameters such as the voltage value, the current value, etc. of the control signal, the characteristic values, the acceptance/rejection result, and others into the personal computer.

Also, when the characteristic values do not satisfy the values specified in the specification, the inspector manually operates the power supply unit 2 while observing the eye pattern and the characteristic values to vary the parameter of the communication device 1.

In this case, in the communication device 1, for example, when only the voltage as the parameter to adjust the offset is varied to increase the offset, the cross point and the amplitude are also changed. In addition, the offset is closely related with other characteristics such as the S/N, the jitter, etc. Therefore, a plurality of parameters must also be operated only when one characteristic value should be improved. Of course, the parameters are handled while checking respective values of a voltmeter, a current meter (both not shown), etc. provided on the power supply unit 2 with the eye to prevent the event that the excessive voltage or current is output to the communication device 1.

Meanwhile, it is not always enough that merely the characteristic values can be kept within requirements in the specification. Ideally, the amplitude and the cross point are better the closer these values are set to the set values (e.g., the amplitude 5 [v], the cross point 50[%]) within the range described in the specification, the S/N is better the larger the value becomes, and the jitter is better the smaller the value becomes, for example.

Also, the inspection must be conducted by adjusting the parameters with regard to the characteristic values that are not described in the specification and are not detected by an analyzing section (not shown)(referred to as "feature amount" hereinafter), and repeating the adjustment to get the high waveform quality. In other words, if the feature amount is not good even though the characteristic values satisfy the specification, in some cases the inspected object is regarded as the defective unit. Therefore, the inspector manually operates a plurality of control parameters while the feature amount and the characteristic value with the eye to execute the adjustment/inspection that are required to get the high waveform quality.

The following documents are referred to as a related art.

[Document 1] Aoki and four others, "DEVELOPMENT OF HBT-IC MODULES FOR 50-GBPS OPTICAL COMMUNICATION SYSTEMS", Yokogawa Technical Report English Edition, Yokogawa Electric Corporation, 2002, No. 34, pp. 1–6

[Document 2] Tsutsumi and five others, "Development of Ultra-compact 10 Gbit/s Bit Error Rate Testers", ANDO TECHNICAL BULLETIN, Ando Electric Co., Ltd., 2004 January, No. 73, pp. 18–22

JP-A-2000-295298 (Paragraph [0002]–[0007], FIG. 3)

In the inspection steps, the waveform image and the characteristic values are displayed automatically on the oscilloscope 3, and the voltage value, the current value, etc. used to control the communication device 1 are displayed automatically on the power supply unit 2. However, in order to not only satisfy the specification but also get the higher waveform quality, the inspector must manually operate a plurality of parameters of the power supply unit 2 while observing them with the eye to search the optimum combination of parameters. Therefore, following problems resided in the related art.

The communication device 1 is a multi-input/multi-output system because there is the multi-to-multi relationship between the control parameters that the inspector can operate and the characteristic values and the feature quantities that are derived from the waveform image. Therefore, it is difficult for the inspector to handle the parameters. Also, in order to control the characteristic values and the feature quantities that are derived from the waveform image, the inspector must operate depending on the know-how and the intuition that the inspector acquires based on the experience. As a result, such a problem existed that the waveform quality is varied. In addition, there existed the problem that the inspection time is varied and prolonged according to a difference in the experience level of the inspector.

Besides, since the inspection that depends on the visual inspection, the personal experience, etc. (sensory inspection) is applied, there also existed following problems that are involved in the sensory inspection itself.

(1) Variation caused by the individual differences. There is a variation caused by the individual difference in the feeling and the discriminating power. Also, there is a lack of balance such that which ones of the characteristic values and the feature quantities should be adjusted mainly.

(2) Influence of the feeling. The five senses are affected by the mood of that day, the inspector's living environment, the state of inspector's health, the fatigue, and others. Therefore, the criteria applied to the inspection are changed every time.

(3) Variation in the expression. Even when the inspector decides that the waveform quality is "very excellent", the individual difference lies in the boundary that is applied to decide whether or not the term "very" should be used. Also, one inspector will give an exaggerated expression whereas the other inspector will give an opposite expression. Because it is difficult to give a concrete expression in the sensory inspection, the individual difference in expression largely appears in the sensory inspection.

(4) Change attendant to a degree of mastery. In the situation that the inspector is versed in the operation, normally such inspector executes the adjustment/inspection without thinking to get the higher waveform quality. Also, a metal state of the inspector is influenced by the change in the external environment. For example, the criteria applied to the inspection become extremely strict when a complaint, or the like is made from the user, and others.

SUMMARY OF THE INVENTION

An object of the present invention is to provide an inspection apparatus capable of obtaining stable results by automating the inspecting steps including the sensory inspection.

The invention provides an inspection apparatus, which inspects an inspected object based on a waveform quality of a signal that the inspected object outputs, having: a power supply section which outputs a control signal that controls an output of the inspected object; a waveform measuring section which measures the signal that the inspected object outputs to generate a waveform image; an analyzing section which derives a value indicating a waveform quality from the waveform image that the waveform measuring section measures; a deciding section which decides whether or not the value derived by the analyzing section satisfies a target value; and an optimizing section which changes a set value of the control signal that the power supply section outputs, based on a decision result of the deciding section.

The invention provides an inspection apparatus, which inspects a communication measuring apparatus based on a waveform quality of a signal that the communication measuring apparatus outputs, wherein the communication measuring includes a communication device and a power supply section outputting a control signal that controls an output of the communication device, having: a waveform measuring section which measures the signal that the communication measuring apparatus outputs to generate a waveform image; an analyzing section which derives a value indicating a waveform quality from the waveform image that the waveform measuring section measures; a deciding section which decides whether or not the value derived by the analyzing section satisfies a target value; and an optimizing section which changes a set value of the control signal that the power supply section of the communication measuring apparatus outputs, based on a decision result of the deciding section.

The invention provides an inspection apparatus, which inspects a waveform measuring apparatus that includes a waveform measuring section which measures an input signal to generate a waveform image, and an analyzing section which derives a value indicating a waveform quality from the waveform image that the waveform measuring section measures, having: a waveform outputting section which outputs a signal to the waveform measuring apparatus according to a control signal; a set value storing section which stores a set value of the control signals and a value of a waveform quality at the set value; a power supply section which outputs a control signal, which is based on the set value in the set value storing section, to the waveform outputting section; and a deciding section which compares the value derived by the analyzing section of the waveform measuring apparatus with the value of the waveform quality in the set value storing section, to decide whether or not the waveform measuring apparatus is acceptable.

The inspection apparatus further has an inspection result storing section which stores the value derived by the analyzing section, a decision result of the deciding section, and the set value of the control signal.

In the inspection apparatus, the waveform image is an eye pattern.

In the inspection apparatus, the analyzing section derives a desired item, as the value indicating the waveform quality, out of an amplitude, an offset, a cross point, an S/N, a jitter, a rise time, a fall time, a ratio between a maximum width and a minimum width at a low level, a ratio between a maximum width and a minimum width at a high level, and an area in a closed domain.

According to the inspection apparatus, the optimizing section calculates the set value of the control signal once again based on the value indicating the waveform quality and the target value in response to the decision result of the deciding section, and then causes the power supply unit to output the control signal by the calculated set value. Then, the adjustment/inspection are carried out repeatedly until the target value is satisfied. As a result, the inspecting steps including the sensory inspection can be automated, and thus the stable results can be obtained and also the man-hour of the inspector can be reduced.

According to the inspection apparatus, the waveform outputting section outputs the signal to the waveform measuring apparatus, based on the set value of the control signal that provides the desired eye pattern. Then, the deciding section compares the value indicating the waveform quality that the waveform measuring apparatus detects with the previously derived value indicating the waveform quality, and then decides whether or not the waveform measuring apparatus should be passed. As a result, the inspecting steps including the sensory inspection can be automated, and therefore the stable results can be obtained and also the man-hour of the inspector can be reduced.

According to the inspection apparatus, the inspection results and the set value of the control signal are saved and stored in the inspection result storing section while repeating the automatic inspection. Therefore, if the inspection results and the set value, which have been saved, are analyzed, the standard waveform that the inspected object or the communication measuring apparatus outputs, and the like can be defined or analyzed. In addition, the set value of the control signal that gives the desired eye pattern, together with the inspected object, can be delivered to the user. As a result, the user can output easily the signals with the high waveform quality by referring to the set value of the control signal.

BRIEF DESCRIPTION OF THE DRAWINGS

FIG. 5 is a view showing an example of a list of inspection results;

FIG. 6 is a view showing a display example of a display screen in the apparatus shown in FIG. 1;

DETAILED DESCRIPTION OF THE PREFERRED EMBODIMENTS

Embodiments of the present invention will be explained with reference to the drawings hereinafter.

[First Embodiment]

Figure 1:
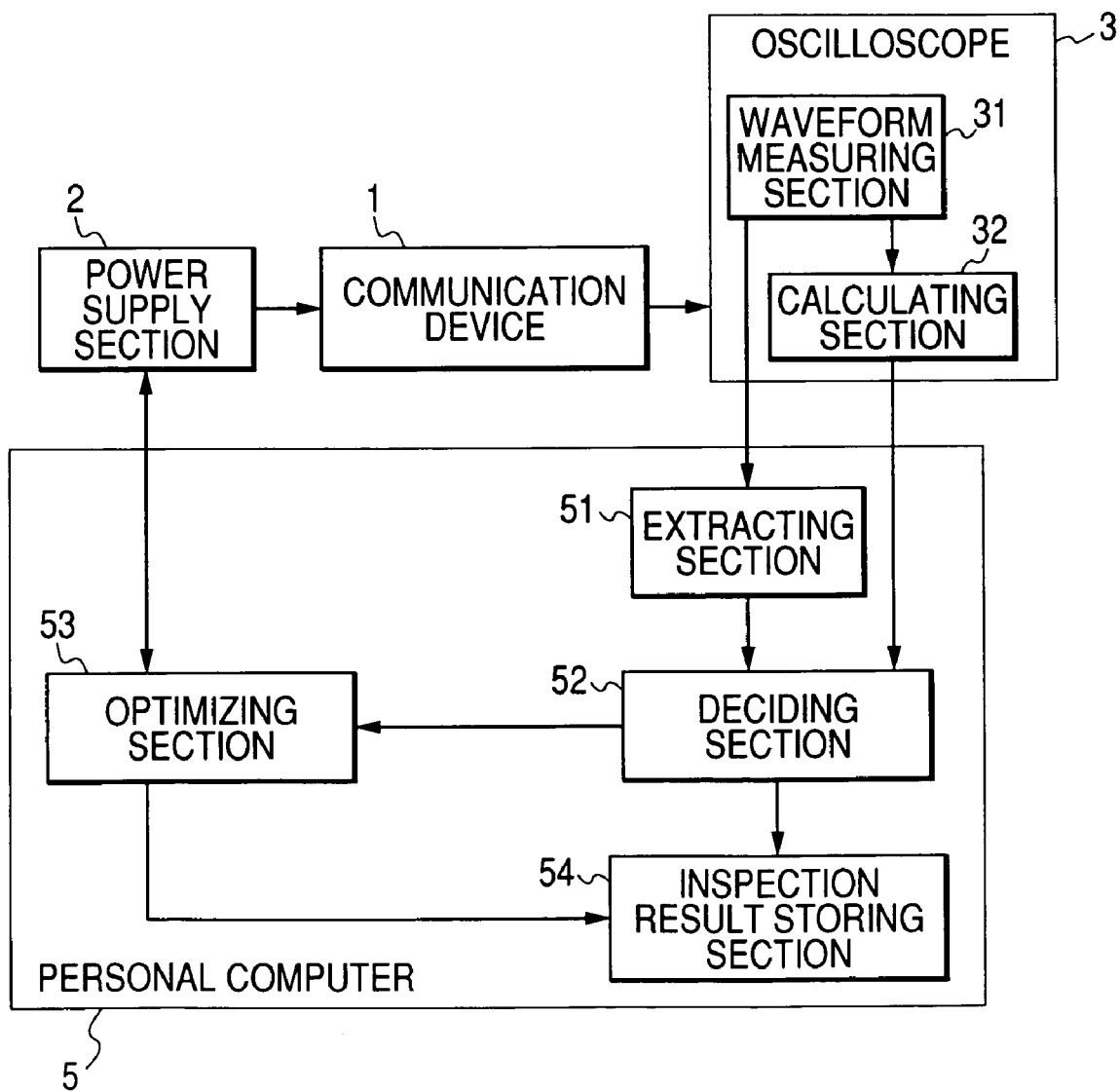
FIG. 1 is a configurative view showing a first embodiment of the present invention.
Figure 8:
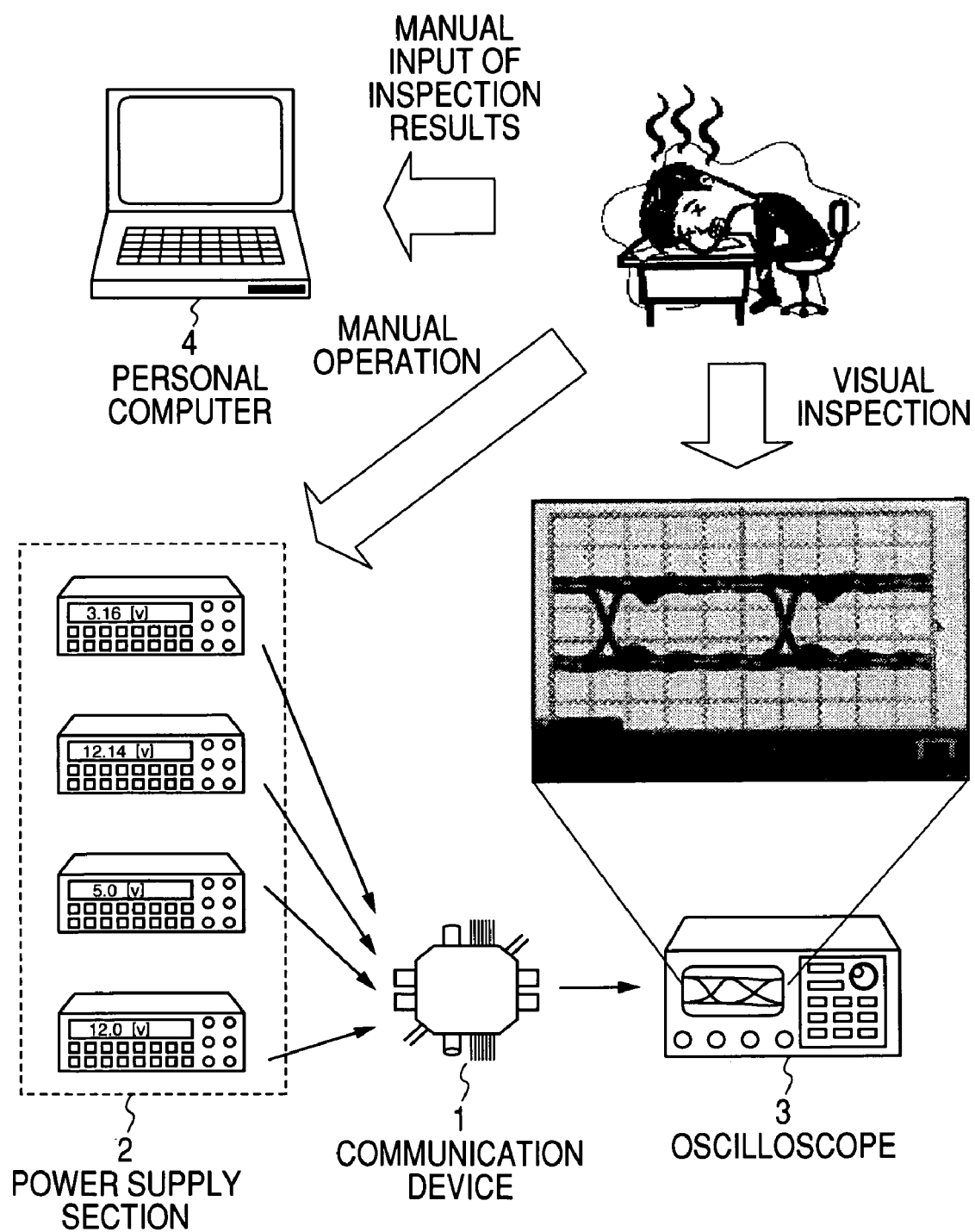
FIG. 8 is a view showing a configuration of an inspection apparatus in the related art.

FIG. 1 is a configurative view showing a first embodiment of the present invention. Here, the same reference numerals are affixed to the same sections as those in FIG. 8 and their explanation will be omitted herein. In FIG. 1, the oscilloscope 3 is a waveform measuring apparatus that has a waveform measuring section 31 and a calculating section 32, and receives a signal from the communication device 1 and outputs a waveform image and the characteristic values. The waveform measuring section 31 measures a signal that the communication device 1 outputs, and then generates the waveform image (e.g., eye pattern). The calculating section 32 calculates values indicating the waveform quality based on the eye pattern. As the parameters indicating the waveform quality, there are an amplitude, an offset, a cross point, an S/N, a jitter, a rise time, a fall time, etc., for example.

In the embodiment, a personal computer 5 is provided in place of the personal computer 4. The personal computer 5 includes an extracting section 51, a deciding section 52, an optimizing section 53, and an inspection result storing section 54, and receives the waveform image of the eye pattern and the characteristic values from the oscilloscope 3. Also, the personal computer 5 receives output values (voltage value, current value, and the like) of the control signals from the power supply unit 2. Then, the personal computer 5 changes set values of the control signals being output from the power supply unit 2.

Figure 2:
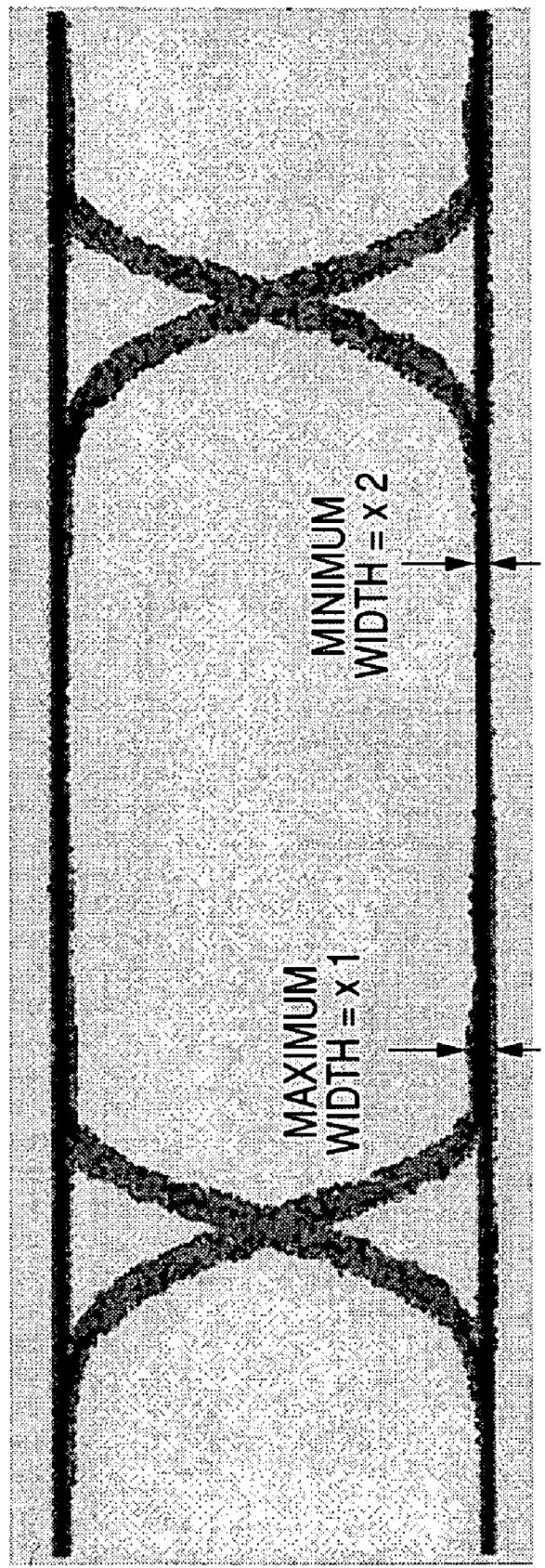
FIG. 2 is a view showing an example of a feature amount.

The extracting section 51 extracts the feature amount, which is the value to indicate the waveform quality, from the eye pattern of the waveform measuring section 31. As the feature amount, there are a ratio between a maximum width and a minimum width at a low level, a ratio between a maximum width and a minimum width at a high level, an area in a desired closed domain, etc., for example. The feature quantities are obtained by quantifying the values that cannot be expressed by S/N, the jitter, and the like. Here, FIG. 2 is a view showing an example of the feature amount, wherein the maximum width X1 and the minimum width X2 at the low level are derived and then a ratio of the widths (X2/X1) is calculated as the feature amount of the eye pattern. In FIG. 2, the high level is given as 1 level and the low level is given as 0 level.

In this case, the calculating section 32 and the extracting section 51 constitute an analyzing section.

The deciding section 52 decides whether or not the value indicating the waveform quality derived from the eye pattern (the characteristic value of the calculating section 32, the feature amount of the extracting section 51) satisfies the target value. Also, the deciding section 52 outputs the decision result to the optimizing section 53 and the inspection result storing section 54.

The optimizing section 53 changes the set values of the control signals being output from the power supply unit 2, based on the decision result from the deciding section 52. The inspection result storing section 54 records the decision result of the deciding section 52, the set values calculated by the optimizing section 53, and the like.

Any connecting section, e.g., GPIB (General Purpose Interface Bus), USB (Universal Serial Bus), RS232C, Ethernet (registered trademark), or the like, may be employed to connect the personal computer 5 and the oscilloscope 3 and connect the personal computer 5 and the power supply unit 2.

Figure 3:
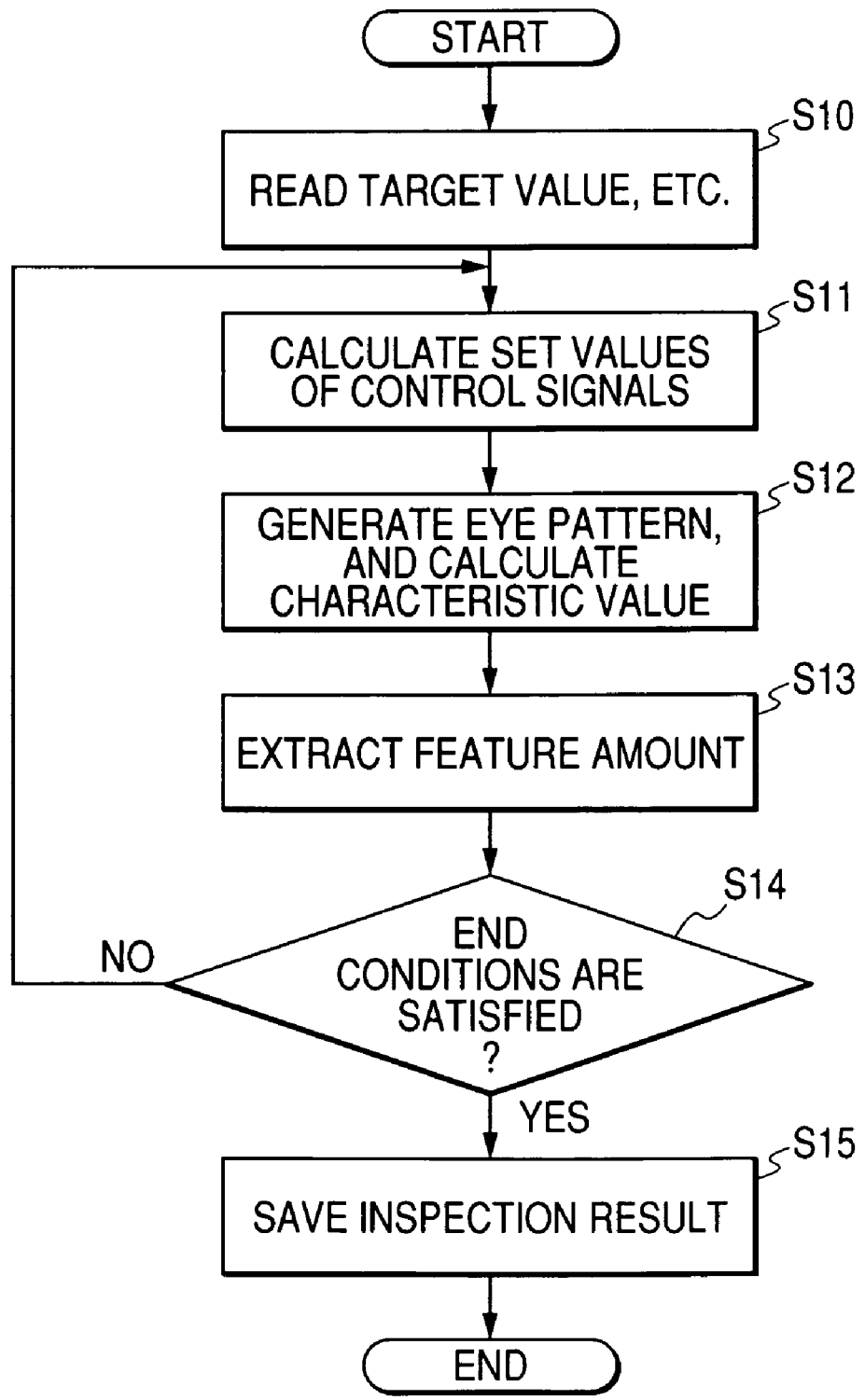
FIG. 3 is a flowchart explaining an operation of a apparatus shown in FIG. 1.

An operation of such inspection apparatus will be explained hereunder. FIG. 3 is a flowchart explaining an operation of a apparatus shown in FIG. 1.

First, the optimizing section 53 reads the set values of the waveform (e.g., amplitude=5 [v], cross point=50 [%], offset=0 [v]) that this optimizing section 53 causes the communication device 1 to output and target values of the characteristic values and the feature quantities corresponding to the set values of the waveform from a target value storing section (not shown). The target value is set to fulfill the specification of the communication device 1. But the target value may be set to the almost same value as that in the specification, or may be set more severely than the specification. Also, the target value may be set while considering previously which ones of the characteristic values and the feature quantities should be adjusted/inspected mainly (S10).

Then, the optimizing section 53 reads an initial value from an initial value storing section (not shown), then calculates the set values (e.g., voltage value) of the control signals applied to the power supply unit 2, and then outputs the calculated set values to the power supply unit 2 (S11).

The power supply unit 2 outputs the control signal generated based on the set values to the communication device 1. Then, the waveform measuring section 31 of the oscilloscope measures the signal output from the communication device 1 to generate the eye pattern, and then outputs the eye pattern to the calculating section 32 and the extracting section 51 of the personal computer 5. The waveform image of the eye pattern may be converted into the bit map, or the like, for example, and then output. Then, the calculating section 32 calculates the characteristic values based on the eye pattern (S12).

The extracting section 51 of the personal computer 5 extracts the feature amount from the eye pattern by applying the image processing to the eye pattern (For example, Ohtani and five others, "Image Quality Inspection Algorithm for Flat Panel Display", Yokogawa Technical Report, Yokogawa Electric Corporation, 2003, Vol. 47, No. 3, pp. 23–26) (S13)

Then, the deciding section 52 decides whether or not the characteristic values fed from the calculating section 32 and the feature quantities fed from the extracting section 51 satisfy the target values. For example, because the amplitude, the offset, and the cross point are better the closer these values are set to the set values of the waveform, the target value is provided to have a particular range. Thus, the characteristic value and the feature amount are acceptable if these values are contained within a range of the target value respectively. Also, because the S/N is better the larger the value becomes, such S/N is decided based on whether or not the S/N is larger than the target value. In addition, because the jitter is better the smaller the value becomes, such jitter is decided based on whether or not the jitter is smaller than the target value. Then, when the characteristic values and the feature quantities satisfy the target values, the deciding section 52 decides that the inspection is ended, and records inspection results in the inspection result storing section 54. In this event, it is preferable that the set values of the waveform, the eye pattern from the waveform measuring section 31, the set values of the control signals calculated by the optimizing section 53, output values (power value, voltage value, current value of the control signals, etc.) fed from the power supply unit 2 to the communication device, the date and time for a measurement, and the like should be recorded at the same time.

Figure 4:
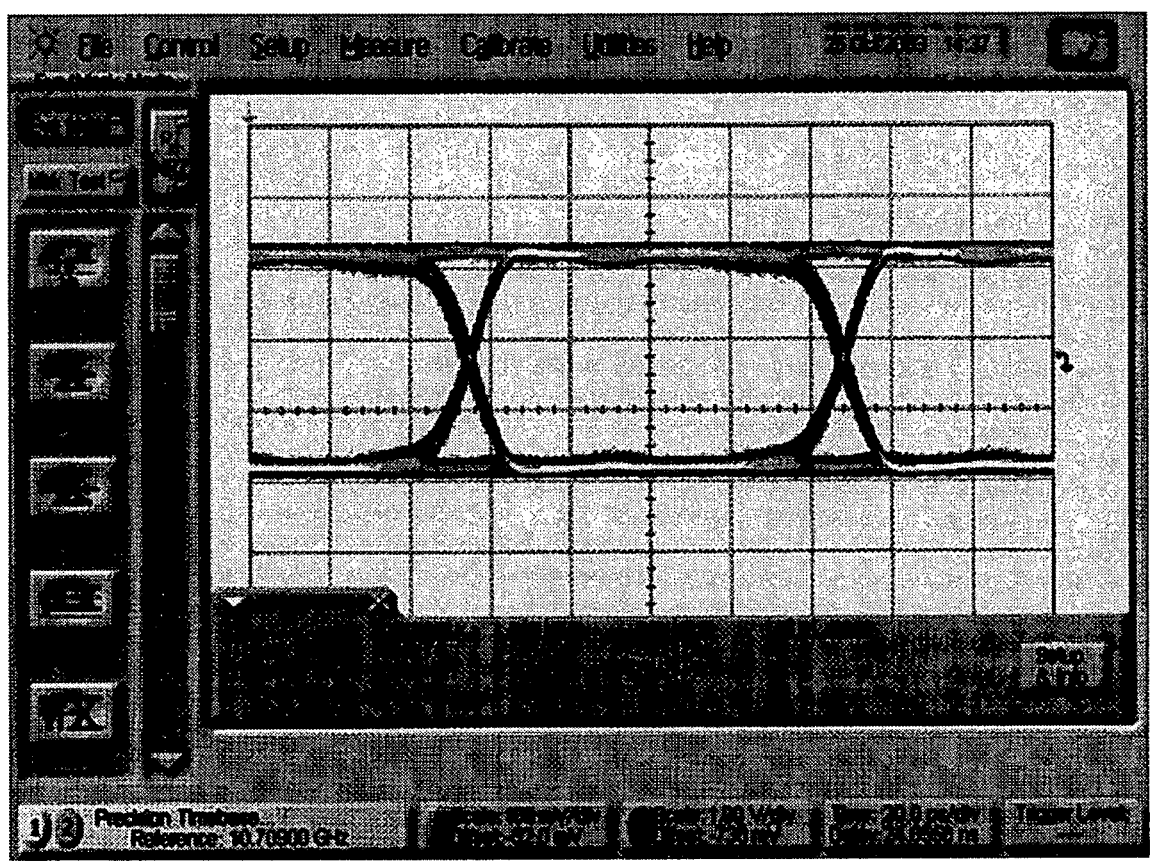
FIG. 4 is a view showing an example of an eye pattern of the inspection result.
Figure 5:
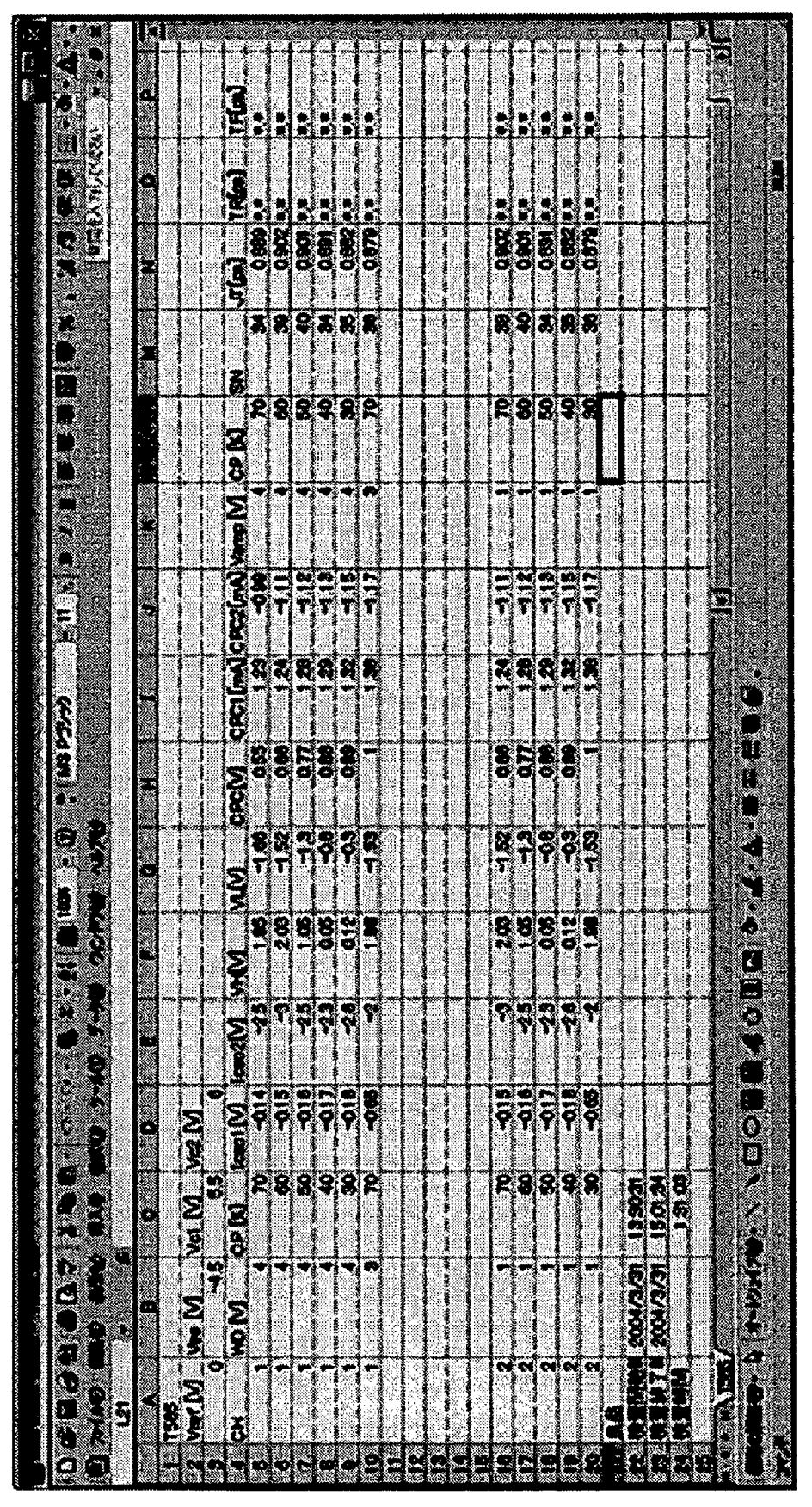

Here, an example of the inspection results is shown in FIG. 4 and FIG. 5. FIG. 4 is an example of the eye pattern to be recorded, and FIG. 5 is an example of a list of inspection results. For example, a module name of the communication device 1 is given in the first line, the voltage value used to operate the communication device 1 is given in the second and third lines, the set values of the waveform, the set values of the control signal applied to the set values of the waveform, the voltage value, the current value, the characteristic value, and the feature amount that the power supply unit 2 outputs are given in the fourth to twentieth lines, the acceptance/rejection result is given in the twenty-first line, the inspection start time is given in the twenty-second line, the inspection end time is given in the twenty-third line, and the inspection time required for the inspection is given in the twenty-fourth line (S14, S15).

Meanwhile, even when any one of the characteristic values and the feature quantities does not satisfy the target value, the inspection end conditions are not satisfied. Therefore, the deciding section 52 decides that the inspection should be continued, then outputs the decision result, the feature amount, and the characteristic value to the optimizing section 53. Then, the optimizing section 53 is caused to calculate the set values of the control signals once again and to change the voltage value of the control signals of the power supply unit 2. Then, the adjustment/inspection are repeated until the inspection end conditions are satisfied (S14, S11 to S13). In case the characteristic values and the feature quantities do not satisfy the target values even after the adjustment/inspection were repeated the predetermined number of times, the deciding section 52 decides that the communication device 1 is the defective unit and then records the rejection in the inspection result storing section 54.

In turn, the optimizing section 53 will be explained hereunder. The communication device 1 is the multi-input/multi-output system because there is the multi-to-multi relationship between the control parameters, which control the signal that the communication device 1 outputs, and the values that are derived from the eye pattern to indicate the waveform quality (the characteristic values and the feature quantities). Accordingly, in order to optimize such multi-input parameters, the algorithm such as the Newton method, the Simplex method, the neural network method, the Taguchi method, or the like may be employed. With regard to the characteristic values of the amplitude, the cross point, and the offset, the parameters are calculated once again to minimize a degree of divergence from the target value. With regard to the characteristic values and the feature quantities of the S/N, the jitter, etc., the parameters are calculated once again in such a way that absolute values of the characteristic values and the feature quantities can be set to the maximum value (or the minimum value) by making the values larger (or smaller) than the target value.

Next, a display example of the inspection apparatus (e.g., a display screen of the personal computer 5) is shown in FIG. 6. For example, in starting the inspection, the module name is input. Then, a save folder for recording the inspection results and a file name are displayed and also inspection conditions such as an inspection start date and time, an inspection end expected date and time, etc. and histories of a non-defective unit rate, etc. are displayed, and then the adjustment/inspection are carried out. Here, an example where two channels are inspected continuously is shown. The set values of the waveform is changed plural times in each channel, and the acceptance or the rejection is displayed with respect to respective set values (for example, the cross point is changed from 40[%] to 70[%] with respect to the amplitudes 1 to 4 [V] respectively). When the inspection is ended, the inspection conditions such as the inspection start date and time, the inspection end date and time, etc. and the histories of the non-defective unit rate, etc. are displayed as the results at this time.

In this manner, the optimizing section 53 calculates the set values of the control signals once again based on the values indicating the waveform quality and the target value in response to the decision result of the deciding section 52, and then causes the power supply unit 2 to output the control signals by the calculated set values. Then, the adjustment/inspection are carried out repeatedly until the target value is satisfied. As a result, the inspecting steps including the sensory inspection can be automated, and thus the stable results can be obtained and also the man-hour of the inspector can be reduced.

Also, the inspection results and the set values of the control signals are saved and stored in the inspection result storing section 54 while repeating the automatic inspection.

Therefore, if the inspection results and the set values, which have been saved, are analyzed, the standard waveform that the communication device 1 outputs, etc. can be defined or analyzed. In addition, preferably the set values of the control signals that give the desired eye pattern, together with the communication device 1, should be delivered to the user. As a result, the user can output easily the signals with the high waveform quality by referring to the set values of the control signals.

[Second Embodiment]

Figure 7:
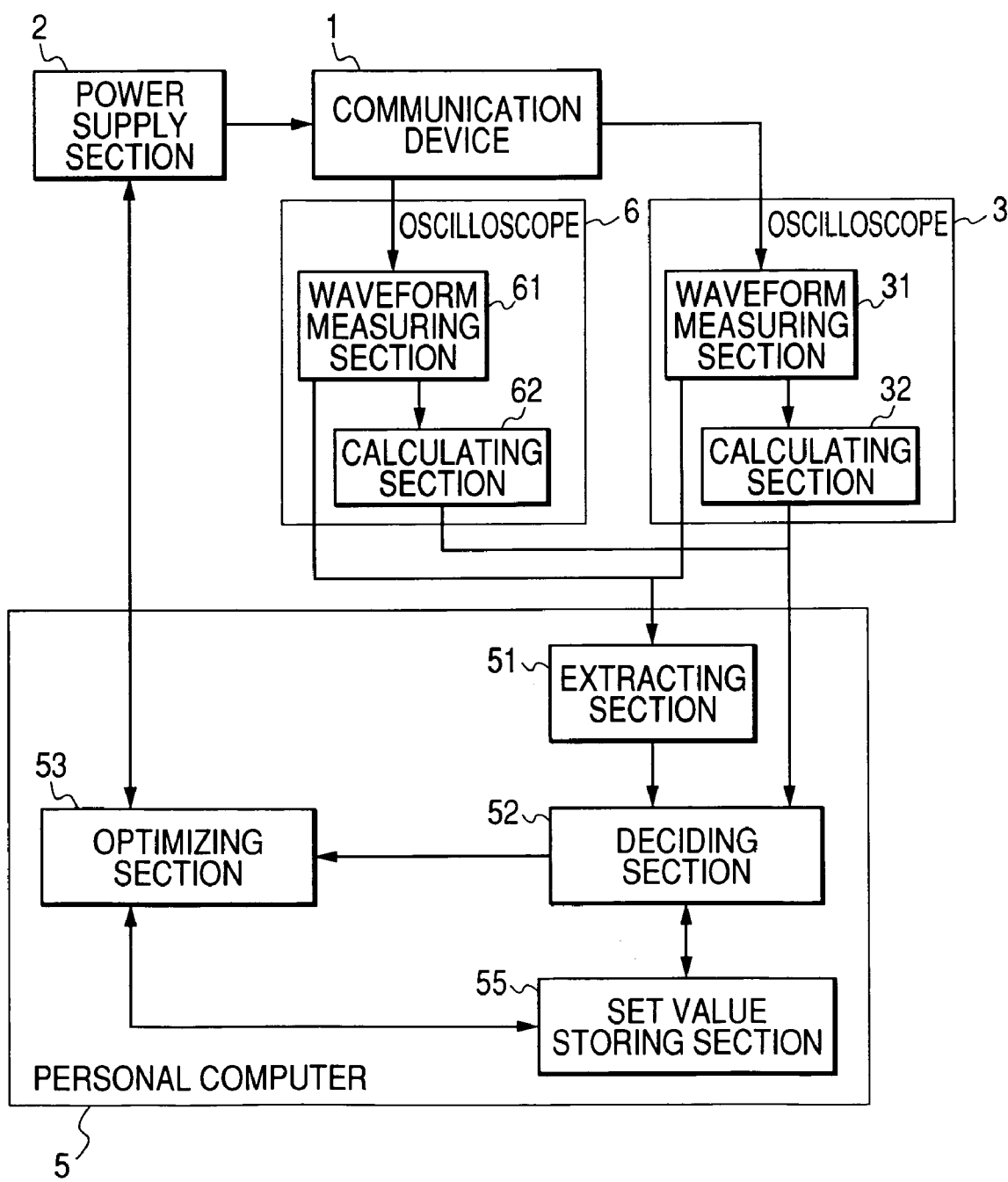
FIG. 7 is a configurative view showing a second embodiment of the present invention.

FIG. 7 is a configurative view showing a second embodiment of the present invention. Here, the same reference numerals are affixed to the same sections as those in FIG. 1, and their explanation will be omitted herein. In FIG. 1, a configuration by which the communication device 1 for outputting the communication digital signal is inspected is shown, but a waveform measuring apparatus for measuring the waveform image and the characteristic values may be inspected.

In FIG. 7, an oscilloscope 6 serving as the inspected object is provided. The oscilloscope 6 is a waveform measuring apparatus that has a waveform measuring section 61 and a calculating section 62, like the oscilloscope 3, and receives the signal from the communication device 1 and outputs the waveform image and the characteristic values to the personal computer 5. The waveform measuring section 61 measures the signal being input from the communication device 1, and generates the waveform image (e.g., the eye pattern). The calculating section 62 is an analyzing section, and calculates a plurality of values indicating the waveform quality respectively from the waveform image that the waveform measuring section 61 measured.

A set value storing section 55 is provided to the personal computer 5 in place of the inspection result storing section 54. The set value storing section 55 is connected to the optimizing section 53 mutually, and stores the set values of the control signal that the optimizing section 53 calculates. Also, the set value storing section 55 is connected to the deciding section 52, and stores the values indicating the waveform quality. In this case, the communication device 1 is a waveform output section. Also, assume that the oscilloscope 3 has already been corrected.

An operation of such inspection apparatus will be explained hereunder.

First, like the apparatus shown in FIG. 1, the set value of the optimum control signal with respect to the set value of the desired waveform is measured by using the oscilloscope 3. Then, the deciding section 52 and the optimizing section 53 store the set values of the optimum control signals and the characteristic values and the feature quantities in this set value into the set value storing section 55.

Then, the oscilloscope 6 as the inspected object is connected to the personal computer 5 instead of the oscilloscope 3. Then, the optimizing section 53 reads the set values of the control signals from the set value storing section 55, and then outputs this value to the power supply unit 2. Accordingly, the power supply unit 2 outputs the control signal generated based on the set values of the control signals to the communication device 1. Then, the communication device 1 outputs the signal to the oscilloscope 6 according to the control signal.

Then, the waveform measuring section 61 of the oscilloscope 6 measures the signal, then generates the waveform image of the eye pattern, and then outputs the image to the calculating section 62 and the extracting section 51. Also, the calculating section 62 calculates the characteristic values from the waveform image, and then outputs the values to the deciding section 52.

Then, the extracting section 51 extracts the feature amount of the eye pattern, and then outputs the feature amount to the deciding section 52. The deciding section 52 reads the characteristic value and the feature amount from the set value storing section 55, then compares these values with the feature amount extracted by the extracting section 51 and the characteristic value calculated by the calculating section 62, and then decides whether or not errors of all the characteristic values and the feature quantities are contained within a predetermined range. The deciding section 52 decides that the oscilloscope 6 is acceptable if the errors are contained within the predetermined range, and decides that the oscilloscope 6 is rejectable if the errors are not contained within the predetermined range.

In other words, the measurement is carried out by using the totally identical inspection system except the oscilloscope 3 and the oscilloscope 6, and also the communication device 1 outputs the signal based on the same control signal. As a consequence, it can be concluded that the reason why different measured results are derived is due to a difference between the oscilloscope 3 and the oscilloscope 6.

In this case, the oscilloscope 6 may be adjusted such that the decision made by the deciding section 52 becomes acceptable.

In this fashion, the communication device 1 outputs the signals to the oscilloscope 6, based on the set values of the control signals that provide the desired eye pattern. Then, the deciding section 52 compares the waveform image and the characteristic values of the oscilloscope 6 with the waveform image and the characteristic values measured previously by the reference oscilloscope 3, and then decides whether or not the oscilloscope 6 should be passed. As a result, the inspecting steps including the sensory inspection can be automated, and therefore the stable results can be obtained and also the man-hour of the inspector can be reduced.

Here, the present invention is not limited to this, and followings can be adopted.

In the apparatus shown in FIG. 1, the configuration for inspecting the communication device 1 as the inspected object is shown. But the present invention may be employed to inspect the communication measuring apparatus that includes the communication device 1 and the power supply unit 2. In other words, in FIG. 1, the communication device 1 and the power supply unit 2 are provided in the communication measuring apparatus. In this case, preferably a storing section for saving the set values of the control signals that give the desired eye pattern should be provided to the communication measuring apparatus. In case the user employs the communication measuring apparatus, the power supply unit reads the set value of the control signal corresponding to the set values of the waveform that are set by the user, and then the power supply unit 2 outputs the control signal based on the set values of the read control signals.

In the apparatus shown in FIG. 7, the configuration in which the power supply unit 2 and the communication device 1 are provided separately is shown. But the communication device 1 and the power supply unit 2 may be provided in the same casing and then may be included in the communication measuring apparatus.

In the apparatus shown in FIG. 1, such a configuration is shown that the extracting section 51, the deciding section 52, the optimizing section 53, and the inspection result storing section 54 are provided in the personal computer 5. But these sections may be provided to the oscilloscope 3.

In the apparatus shown in FIG. 7, the configuration in which the extracting section 51 is provided to the personal computer 5 is shown. But the extracting section 51 may be provided to the oscilloscopes 3, 6.

In the apparatus shown in FIG. 1, such a configuration is shown that the deciding section 52 decides that the inspection should be continued or the module is rejectable even if any one of the feature quantities and the characteristic values does not satisfy the target value. But it may be decided that, if only the desired item satisfies the target value, the module is acceptable. Also, the end conditions may be provided in addition to the feature amount and the characteristic value. Of course, the repletion of the inspection is ended if predetermined end conditions are satisfied.

In the apparatus shown in FIG. 7, such a configuration is shown that the deciding section 52 decides that, if any one error of the feature quantities and the characteristic values is large, the module is rejectable. But it may be decided that, if an error of the desired item is contained within a predetermined range, the module is acceptable. Also, other deciding conditions may be provided in addition to the feature amount and the characteristic value.

In the apparatus shown in FIG. 1, even when the same control signals are input from the power supply unit 2 to the communication device 1 and the communication measuring apparatus, in some cases the waveform quality is deteriorated owing to a change over the years while these devices are used for a long term. In this case, in order to correct the communication device 1 and the communication measuring apparatus, which are subjected to the time dependent change, the inspection apparatus of the present invention may be employed.

In the apparatus shown in FIG. 7, even when the same control signals are input from the communication device 1 to the oscilloscope 6, in some cases the measured results of the waveform measuring section 61 become different due to the change over the years while this device is used for a long term. In this case, the inspection may be applied to the oscilloscope 6 that is subjected to the time dependent change.

In the apparatuses shown in FIG. 1 and FIG. 7, the configuration in which the extracting section 51 extracts the feature amount is shown. But the extracting section 51 may be omitted herein. In this case, the deciding section 52 may make the decision from the characteristic values and the target values.

In the apparatuses shown in FIG. 1 and FIG. 7, a plurality of sets of the target values of the characteristic values and the target values of the waveform signal that the communication device 1 outputs may be set. In particular, in the case of the device that operates in a wide dynamic range, it is effective in deciding a plurality of target values as a series of inspections that a number of the characteristic values and the target values of the waveform should be set and the inspection should be executed repeatedly.

What is claimed is:

1. An inspection apparatus, which inspects an inspected object based on a waveform quality of a signal that the inspected object outputs, comprising:
 a power supply section which outputs a control signal that controls an output of the inspected object;
 a waveform measuring section which measures the signal that the inspected object outputs to generate a waveform image;
 an analyzing section which derives a value indicating a waveform quality from the waveform image that the waveform measuring section measures;
 a deciding section which decides whether or not the value derived by the analyzing section satisfies a target value; and
 an optimizing section which changes a set value of the control signal that the power supply section outputs, based on a decision result of the deciding section.

2. An inspection apparatus, which inspects a communication measuring apparatus based on a waveform quality of a signal that the communication measuring apparatus outputs, wherein the communication measuring includes a communication device and a power supply section outputting a control signal that controls an output of the communication device, comprising:
 a waveform measuring section which measures the signal that the communication measuring apparatus outputs to generate a waveform image;
 an analyzing section which derives a value indicating a waveform quality from the waveform image that the waveform measuring section measure;
 a deciding section which decides whether or not the value derived by the analyzing section satisfies a target value; and
 an optimizing section which changes a set value of the control signal that the power supply section of the communication measuring apparatus outputs, based on a decision result of the deciding section.

3. An inspection apparatus, which inspects a waveform measuring apparatus that includes a waveform measuring section which measures an input signal to generate a waveform image, and an analyzing section which derives a value indicating a waveform quality from the waveform image that the waveform measuring section measures, comprising:
 a waveform outputting section which outputs a signal to the waveform measuring apparatus according to a control signal;
 a set value storing section which stores a set value of the control signals and a value of a waveform quality at the set value;
 a power supply section which outputs a control signal, which is based on the set value in the set value storing section, to the waveform outputting section; and
 a deciding section which compares the value derived by the analyzing section of the waveform measuring apparatus with the value of the waveform quality in the set value storing section, to decide whether or not the waveform measuring apparatus is acceptable.

4. The inspection apparatus according to claim 1, further comprising:
 an inspection result storing section which stores the value derived by the analyzing section, a decision result of the deciding sections, and the set value of the control signal.

5. The inspection apparatus according to claim 2, further comprising:
 an inspection result storing section which stores the value derived by the analyzing sections, a decision result of the deciding section, and the set value of the control signal.

6. The inspection apparatus according to claim 1, wherein the waveform image is an eye pattern.

7. The inspection apparatus according to claim 2, wherein the waveform image is an eye pattern.

8. The inspection apparatus according to claim 3, wherein the waveform image is an eye pattern.

9. The inspection apparatus according to claim 1,
wherein the analyzing section derives a desired item, as the value indicating the waveform quality, out of an amplitude, an offset, a cross point, an S/N, a jitter, a rise time, a fall time, a ratio between a maximum width and a minimum width at a low level, a ratio between a maximum width and a minimum width at a high level, and an area in a closed domain.

10. The inspection apparatus according to claim 2,
wherein the analyzing section derives a desired item, as the value indicating the waveform quality, out of an amplitude, an offset, a cross point, an S/N, a jitter, a rise time, a fall time, a ratio between a maximum width and a minimum width at a low level, a ratio between a maximum width and a minimum width at a high level, and an area in a closed domain.

11. The inspection apparatus according to claim 3,
wherein the analyzing section derives a desired item, as the value indicating the waveform quality, out of an amplitude, an offset, a cross point, an S/N, a jitter, a rise time, a fall time, a ratio between a maximum width and a minimum width at a low level, a ratio between a maximum width and a minimum width at a high level, and an area in a closed domain.

12. The inspection apparatus according to claim 1,
wherein said signal that the inspected object outputs comprises a communication channel.

13. The inspection apparatus according to claim 12,
wherein said signal that the inspected object outputs comprises multiple simultaneous communication channels.

14. The inspection apparatus according to claim 2,
wherein said signal that the inspected object outputs comprises a communication channel.

15. The inspection apparatus according to claim 14,
wherein said signal that the inspected object outputs comprises multiple simultaneous communication channels.

16. The inspection apparatus according to claim 3,
wherein said signal that the inspected object outputs comprises a communication channel.

17. The inspection apparatus according to claim 16,
wherein said signal that the inspected object outputs comprises multiple simultaneous communication channels.

* * * * *